United States Patent
Chen et al.

(10) Patent No.: US 8,518,722 B2
(45) Date of Patent: Aug. 27, 2013

(54) METHOD FOR DETECTING THE UNDER-FILL VOID IN FLIP CHIP BGA

(75) Inventors: Chien-Wen Chen, Xizhi (TW);
Chia-Jen Kao, Hsinchu (TW);
Jui-Cheng Chuang, Kaohsiung (TW)

(73) Assignee: Global Unichip Corporation (TW)

( * ) Notice: Subject to any disclaimer, the term of this patent is extended or adjusted under 35 U.S.C. 154(b) by 43 days.

(21) Appl. No.: 13/064,161

(22) Filed: Mar. 9, 2011

(65) Prior Publication Data

US 2012/0052603 A1     Mar. 1, 2012

(30) Foreign Application Priority Data

Aug. 31, 2010   (TW) .............................. 99129198 A

(51) Int. Cl.
*H01L 21/66* (2006.01)

(52) U.S. Cl.
USPC ............. 438/15; 438/108; 438/112; 438/122; 257/E21.503; 257/E21.53

(58) Field of Classification Search
USPC ............. 438/108, 112, 122, 15; 257/E21.53, 257/E21.503
See application file for complete search history.

(56) References Cited

U.S. PATENT DOCUMENTS

| | | | |
|---|---|---|---|
| 6,861,750 B2* | 3/2005 | Zhao et al. | 257/739 |
| 2002/0121680 A1* | 9/2002 | Ahn et al. | 257/666 |

* cited by examiner

*Primary Examiner* — Zandra Smith
*Assistant Examiner* — Toniae Thomas
(74) *Attorney, Agent, or Firm* — Bacon & Thomas, PLLC

(57) ABSTRACT

A method for detecting the under-fill void of the flip chip ball grid array package structure is provided, which includes providing a substrate having an interconnect structure and a plurality of interposers therein; providing a chip having an active surface and a back side, and a plurality of first connecting elements on the active surface of the chip; mounting and electrically connecting the active surface of the chip on the substrate; performing at least once IR reflow to fix the plurality of first connecting elements on the substrate; filling an encapsulate material to cover the active surface of the chip and the plurality of first connecting elements; performing a detecting process to detect that void is not formed between the active surface of the chip and the plurality of first elements; and forming a plurality of second connecting elements on the back side of the substrate to obtain a flip chip ball grid array package structure.

16 Claims, 5 Drawing Sheets

METHOD FOR DETECTING THE UNDER-FILL VOID IN FLIP CHIP BGA

BACKGROUND OF THE INVENTION

1. Field of the Invention

The present invention related to a method for fabricating flip chip ball grid array package structure, and more particularly to a method for detecting the under fill void in the flip chip ball grid array package structure.

2. Description of the Prior Art

Ball grid array (BGA) is an advanced type of integrated circuit packaging technology which is characterized by the use of an organic substrate whose upper surface is mounted with a semiconductor chip and whose lower surface is mounted with a grid array of solder balls. During a surface mount technology process, for example, the BGA package can be mechanically bonded and electrically coupled to a printed circuit board (PCB) by means of these solder balls.

Flip chip ball grid array is a more advanced type of BGA technology that uses flip chip technology in mounting the active side of the chip in an upside-down manner over the substrate and bonded to the same by means of a plurality of solder bumps attached to input/output pads thereon. Due to the inherent coefficient of thermal expansion (CTE) mismatches between the FCBGA package components such as for example the chip, substrate, and underfill (an adhesive flowed between the chip and substrate), high package warpage and thermal stresses are frequently induced in the FCBGA package. These high thermal stresses and warpage not only lead to the delamination in the low-k interconnect layer(s) in the chip, but also cause solder bump cracks leading to failure, degrading the long term operating reliability of the FCBGA package. Furthermore, the substrate onto which the flip chip may be mounted can be a single layer structure, or the substrate may comprise two or many more layers of materials. Often these materials tend to be quite diverse in their composition and structure. The coefficient of thermal expansion for these different layers may be considerably different and may result in uncontrolled bending or thermal induced substrate surface distortions. Such distortions can cause failure of the flip chip or other components of the substrate.

With the introduction of new components and materials such as inorganic substrates (e.g. ceramic) for FCBGA packaging, the above problems become more pronounced due to the coefficient of thermal expansion mismatches among these components.

For these reasons and other reasons that will become apparent upon reading the following detailed description, there is a need for an improved FCBGA package that reduces and/or eliminates the component and/or board level reliability problems of conventional FCBGA packages due the coefficient of thermal expansion mismatches among these components.

In addition, FIG. 1A shows a high-performance and enhanced flip chip ball grid array package structure with a metal ring that is to be supported the heat plate whose covers on the flip chip ball array package structure. In FIG. 1A, the conventional flip chip ball grid array package structure includes a substrate 100, a chip 110 which is mounted on the top surface (not shown) of the substrate 100, a metal ring 130 which is disposed around the peripheral of the top surface of the chip 110, and a heat plate 140 which is disposed on the top of the metal ring 130. Generally, the chip 110 is electrically connected the substrate 100 by solder ball 112 which is covered by the under fill material 114. The plurality of solder balls 150 is disposed on the back surface (not shown) of the substrate 100, so that the package structure can be electrically connected with the exterior electronic device.

The above package structure must be required a lot of processes with high temperature when the packaging process is performed, for example, the package structure is disposed in an environment with high temperature during the reflow process or under fill process. Nevertheless, when the substrate 100 is disposed under the environment with high temperature, the substrate could be overheated to generate the warpage. Now, the metal ring 130 can increase the strength for the substrate 100 to avoid the excessive warpage generating in the substrate 100.

Because of the metal ring 130 is merely disposed on the top surface of the substrate 100 for the conventional package structure, the metal ring 130 would be peeled when the excessive deflection is generated in the substrate 100.

Beside, the inadequate height of the solder ball 112 on the active surface of the chip 110 will introduce the void 120 (as shown in FIG. 1B) that is formed in the connecting interface between the molding material 114 and the solder ball 112 on the active surface of the chip 110 when the molding material 114 is filled to encapsulate the chip 110 and the substrate 100. Thus, the circuit short for the connecting elements of the chip 110 would be generated, and the package chip or package structure could not be operated.

SUMMARY OF THE INVENTION

According to above problems, the major object of the present invention is that an IR reflow process is performed after the chip is mounted on the substrate, such that the connecting element on the chip is fixed on the substrate. Thus, the under-filling material can be encapsulated between the active surface of the chip and substrate completely, and no void is formed therebetween after under-filling process is performed.

Another object of the present invention is to provide an X-ray detecting method to detect the void that is not formed in connecting interface between the active surface of the chip and the substrate.

According to above objects, the present invention provides a method for fabricating flip chip ball grid array package structure, which includes providing a substrate that includes an interconnect structure and a plurality of interposers therein; providing a chip which includes an active surface and a back surface, and a plurality of first connecting elements on the active surface of the chip; mounting the chip on the substrate by inversing the active surface of the chip toward the top surface of the substrate, and the plurality of first connecting elements is electrically connected the interconnect structure by the plurality of interposers; performing at least one IR reflow process to fix the plurality of first connecting elements of the chip on the substrate; filling a molding material to encapsulate the active surface of the chip and the plurality of first connecting elements; performing a detecting process to detect the void that is not formed in the connecting interface between the plurality of first connecting elements and the active surface of the chip; and forming a plurality of second connecting elements on a back surface of the substrate to accomplish a flip chip ball grid array package structure.

Then, the present invention also provides another method for fabricating flip chip ball grid array package structure, which includes providing a substrate having an interconnect structure and a plurality of interposers therein; providing a chip having an active surface and a back surface, and a plurality of first connecting elements on the active surface of the chip; mounting the chip on the substrate by inversing the active surface of the chip toward the top surface of the substrate and the plurality of first connecting elements is electrically connected the interconnect structure by the plurality of interposers; performing at least one IR reflow process to fix the plurality of first connecting elements on the substrate; pre-filling a molding material to encapsulate the active surface of the chip and the plurality of first connecting elements; performing a detecting process to detect the void that is not formed in the connecting interface between the plurality of first connecting elements and the substrate; performing another filling process to fill the molding material till the void is not formed in the connecting interface between the plurality of the first connecting elements and the active surface of the chip; forming a plurality of support elements adjacent the chip and electrically insulated from the chip on the substrate; and forming a plurality of second connecting elements on a back surface of the substrate to accomplish a flip chip ball grid array package structure.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention will now be described more fully hereinafter with reference to the accompanying drawings, in which preferred embodiments are shown. The objection of the present invention is to provide a method for detecting the under fill void in the flip chip ball grid array package structure. In the following, the well-known knowledge regarding the of the invention such as the formation of chip and the process for forming flip chip ball grid array package structure would not be described in detail to prevent from arising unnecessary interpretations. However, this invention will be embodied in many different forms and should not be construed as limited to the embodiments set forth herein.

Figures 2A, 2B:
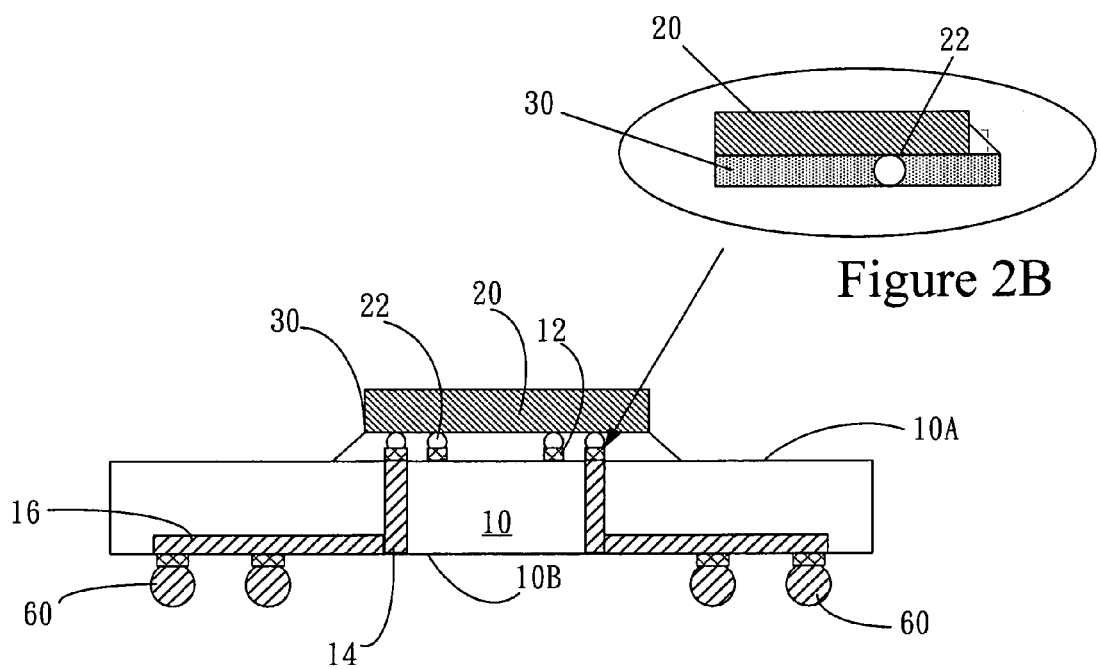
FIG. 2A shows a cross-sectional view of the void is not formed in the flip chip ball grid array package structure according the present invention disclosed herein.
FIG. 2B shows a magnified view of the void is not formed in the flip chip ball grid array package structure according to the present invention disclosed herein.

Please refer to FIG. 2A which shows a cross-sectional view of the flip chip ball grid array package structure of the present invention. In FIG. 2A, the flip chip ball grid array package structure includes a substrate 10 having a plurality of interposers 14 and an interconnect structure 16 therein, and a circuit pattern (not shown) is arranged on the top surface 10A and the back surface 10B of the substrate 10 respectively. The interposer 14 and the interconnect structure 16 are used to electrically connect the top surface 10A and the back surface 10B of the substrate 10 respectively. A chip 20 includes an active surface (not shown) and a back surface (not shown), and a plurality of first connecting elements 22 on the active surface of the chip 20. Then, the active surface of the chip 20 is inversed toward the top surface 10A of the substrate 10 by using the flip chip technology, and is mounted on the top surface 10A of the substrate 10 by the plurality of first connecting elements 22. Next, a molding material 30 is filled to encapsulate the active surface of the chip 20 and the plurality of first connecting elements 22. Next, a plurality of second connecting elements 60 is disposed on the back surface 10B of the substrate 10 to obtain a flip chip ball grid array package structure. In this embodiment, the chip 20 can be a CSRAM (custom static random access memory), and the material of the molding material 30 can be epoxy resin.

Figures 3A, 3B:
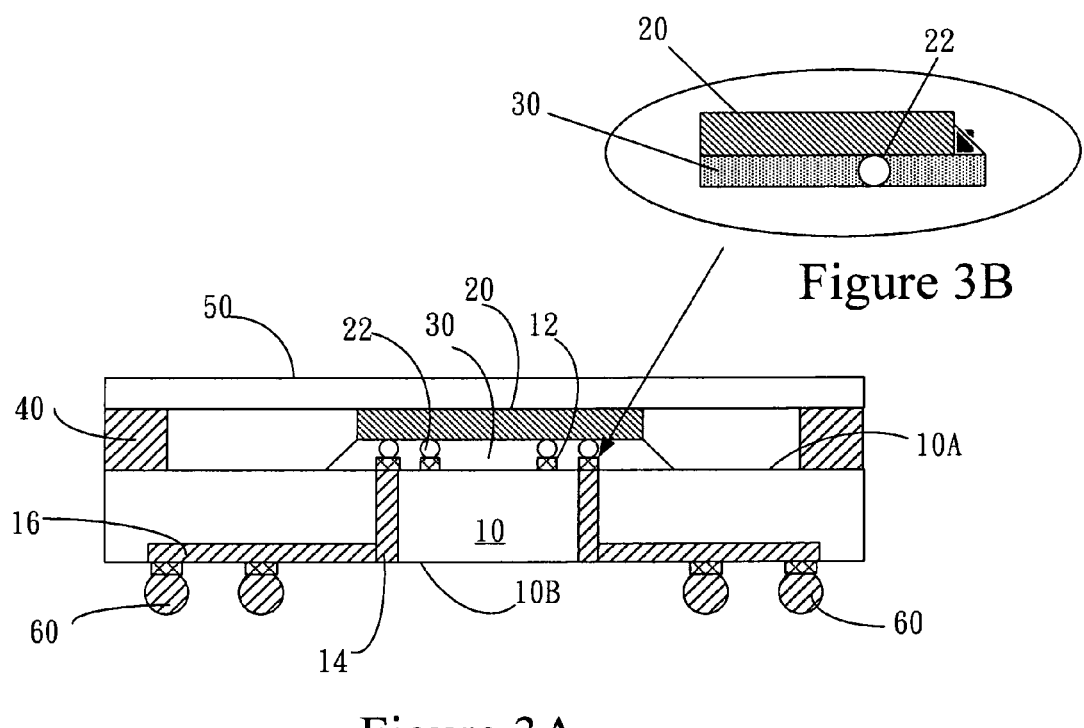
FIG. 3A shows a cross-sectional view of the void that is not formed in the flip chip ball grid array package structure with a plurality of support elements and the heat dissipating elements according to the present invention disclosed herein.
FIG. 3B shows a magnified view of the void that is not formed in flip chip ball grid array package structure with a plurality of support elements and a heat dissipating element according to the present invention disclosed herein.

Next, please refer to FIG. 3A which shows another embodiment of the flip chip ball grid array package structure of the present invention. In FIG. 3A, the flip chip ball grid array package structure includes a substrate 10 having a plurality of interposers 14 and an interconnect structure 16 therein, and a plurality of circuit patterns (not shown) is arranged on the top surface 10A and on the bottom surface 10B of the substrate 10 respectively. The plurality of interposers 14 and the interconnect structure 16 are used to electrically connect the top surface 10A and on the back surface 10B of the substrate 10 respectively. A chip 20 includes an active surface (not shown) and a back surface (not shown), and a plurality of first connecting elements 22 on the active surface of the chip 20. Then, the active surface of the chip 20 is inversed toward the top surface 10A of the substrate 10 by using flip chip technology, and is mounted on the top surface 10A of the substrate 10 by the plurality first connecting elements 22. Next, a molding material 30 is filled to encapsulate the active surface of the chip 20 and the plurality of first connecting elements 22. Then, a plurality of support elements 40 is disposed adjacent the chip 20 but electrically insulated from the chip 20 on the top surface 10A of the substrate 10. The support elements 40 can be made by copper, copper-carbon, copper-tungsten, aluminum silicon carbide, aluminum, stainless, nickel, nickel-coated copper. Next, a heat dissipating element 50 is disposed on a back surface (not shown) of the plurality of support elements 40 and on the back surface (not shown) of the chip 20. Then, a plurality of second connecting elements 60 is formed on the back surface 10B of the substrate 10 to obtain the flip chip ball grid array package structure. Similarly, in this embodiment, the chip 20 can be CSRAM (custom static RAM), and the material of molding material 30 can be epoxy resin.

In addition, the plurality of support elements 40 is used to increase the strength of the substrate 10 to reduce the warpage that would be generated in the substrate 10. Furthermore, an adhesive layer (not shown) is further formed between the plurality of support elements 40 and the substrate 10 to fix the plurality of support elements 40 on the substrate 10. Moreover, for the purpose of the heat dissipating, a heat dissipating elements 50 is further disposed on a back surface of the plurality of support elements 40 and on the back surface of the chip 20 to remove the heat from the chip 20 to outside when the flip chip ball grid array package structure is operated. Similarly, another adhesive layer (not shown) is further formed between the heat dissipating element 50 and the plurality of support elements 40 and is formed between the heat dissipating elements 50 and the back surface of the chip 20 to fix the heat dissipating element 50 on the back surface of the plurality of support elements 40 and on the back surface (not shown) of the chip 20 tightly.

Figures 1A, 1B:
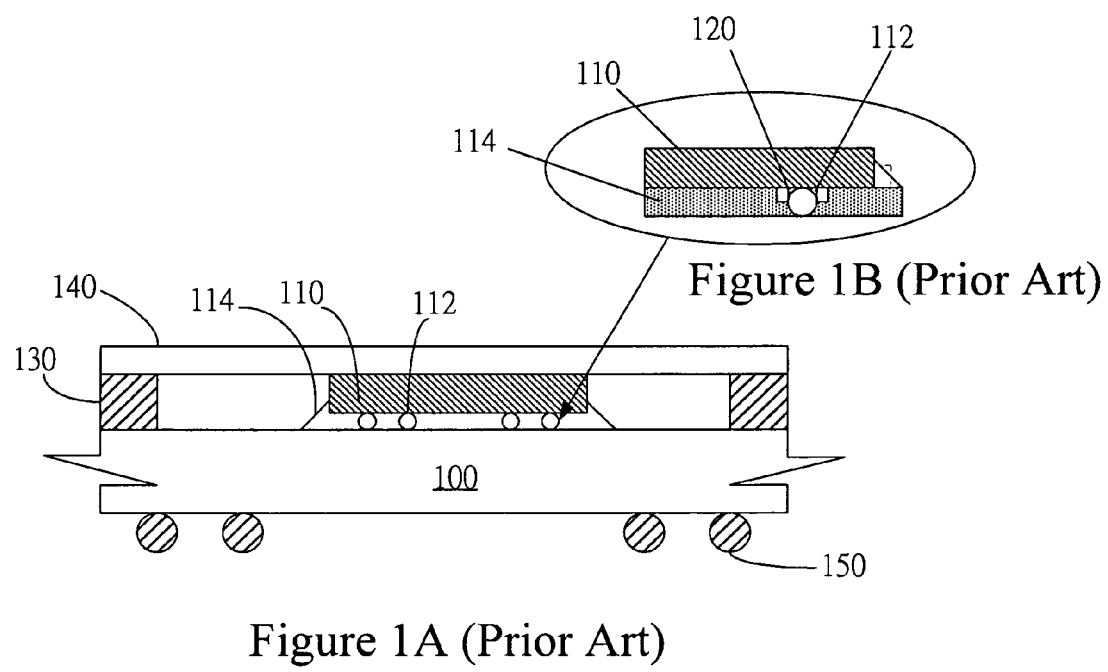
FIG. 1A shows a cross-sectional view of flip-chip ball grid array package structure according to the conventional prior art.
FIG. 1B shows a magnified view of under fill void in the flip chip ball grid array package structure according to the conventional prior art.

Thus, according to aforementioned of FIG. 2A and FIG. 3A, an IR reflow process is performed to fix the plurality of first connecting elements 22 of the active surface of the chip 20 on the plurality of pads 12 on the top surface 10A of the substrate 10 before the molding material 30 is filled. In this embodiment, the purpose of using one or more than once IR reflow process is that the IR reflow with good penetration to uniformly increase the temperature within the solder paste (not shown) when the volatile material is discharged from the molding material, such that the plurality of first connecting elements 22 on the active surface (not shown) of the chip 20 to be heated uniformly. Thus, the gap (for example, the gap 120 shown in FIG. 1B) would not be generated when the plurality of first connecting elements 22 is formed on the active surface of the chip 20; thus, the chip 20 is fixed completely on the top surface 10A of the substrate 10 by the plurality of first connecting elements 22.

Then, a molding material 30 is filled between the plurality of first connecting elements 22 on the active surface of the chip 20 and the top surface 10A of the substrate 10 by under-filling process. Next, a detecting process, such as X-ray detecting method, is performed to detect the void (for example, the reference number 120 shown in FIG. 1B) that is not formed in the connecting interface between the plurality of first connecting elements 22 and the active surface of the chip 20. According to aforementioned, the plurality of first connecting elements 22 is to be heated uniformly due to the IR reflow with uniformly heating characteristic, such that the molding material 30 is encapsulated completely between the plurality of first connecting elements 22 on the active surface of the chip 20 and the top surface 10A of the substrate 10; thus, the void would not be formed in the connecting interface (that is, the gap is formed between the connecting interface between the straight line (chip 20) and the curved line (the first connecting elements 22)) between the plurality of first connecting elements 22 and the active surface of the chip 20. Thereafter, the molding material 30 is continuously filled to encapsulate the active surface of the chip 20 and the plurality of first connecting elements 22 completely.

According abovementioned, it can be obtained that the molding material 30 is completely filled and is encapsulated between the active surface (not shown) of the chip 20 and the plurality of first connecting elements 22, such that the void is not formed to cause the circuit short for the chip 20 in FIG. 2B and FIG. 3B.

Figure 4:
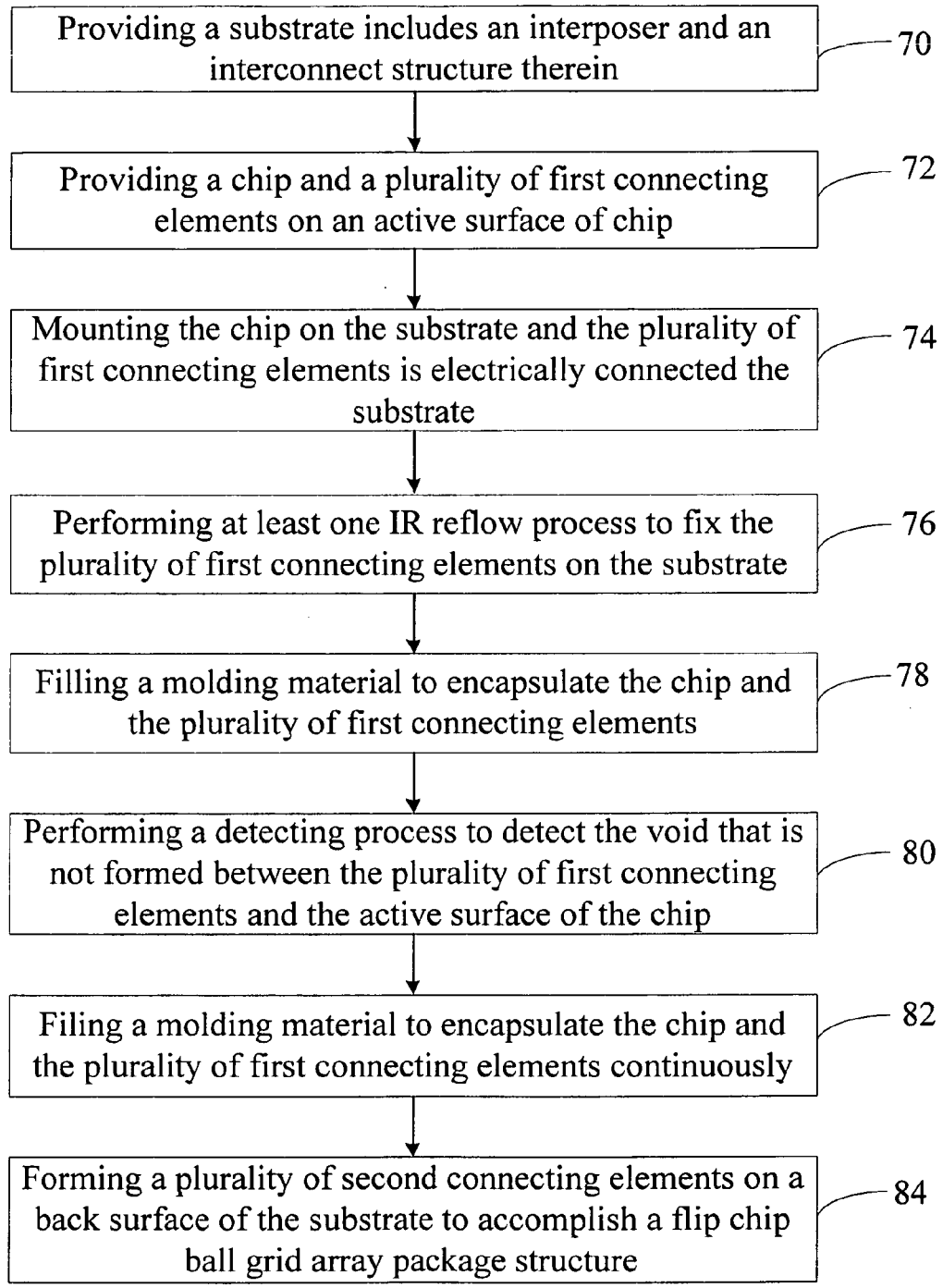
FIG. 4 shows the flow chart for detecting the under fill void in flip chip ball grid array package structure according to FIG. 2A and FIG. 2B of the present invention.

Then, referring to FIG. 4, shows the flow chart for detecting the flip chip ball grid array package structure according to FIG. 2A and FIG. 2B. In step 70, a substrate includes a top surface and a back surface, and a plurality of pads on the active surface, and the substrate includes an interposer and an interconnect structure therein; in step 72, a chip includes an active surface and a plurality of first connecting elements on the active surface; in step 74, the active surface of the chip is inversed toward the top surface of the substrate and is mounted on the top surface of the substrate by using flip chip technology, and the plurality of first connecting elements is electrically connected the substrate by the interconnect structure and the interposer; in step 76, at least one IR reflow process is performed to fix the plurality of first connecting elements of the active surface of the chip on the substrate; in step 78, a molding material is filled to encapsulate the active surface of the chip and the plurality of first connecting elements; in step 80, a detecting process is performed to detect the void that is not formed in the connecting interface between the active surface of the chip and the plurality of first connecting elements; and in step 82, a plurality of second connecting elements is formed on a back surface of the substrate to accomplish the flip chip ball grid array package structure.

Figure 5:
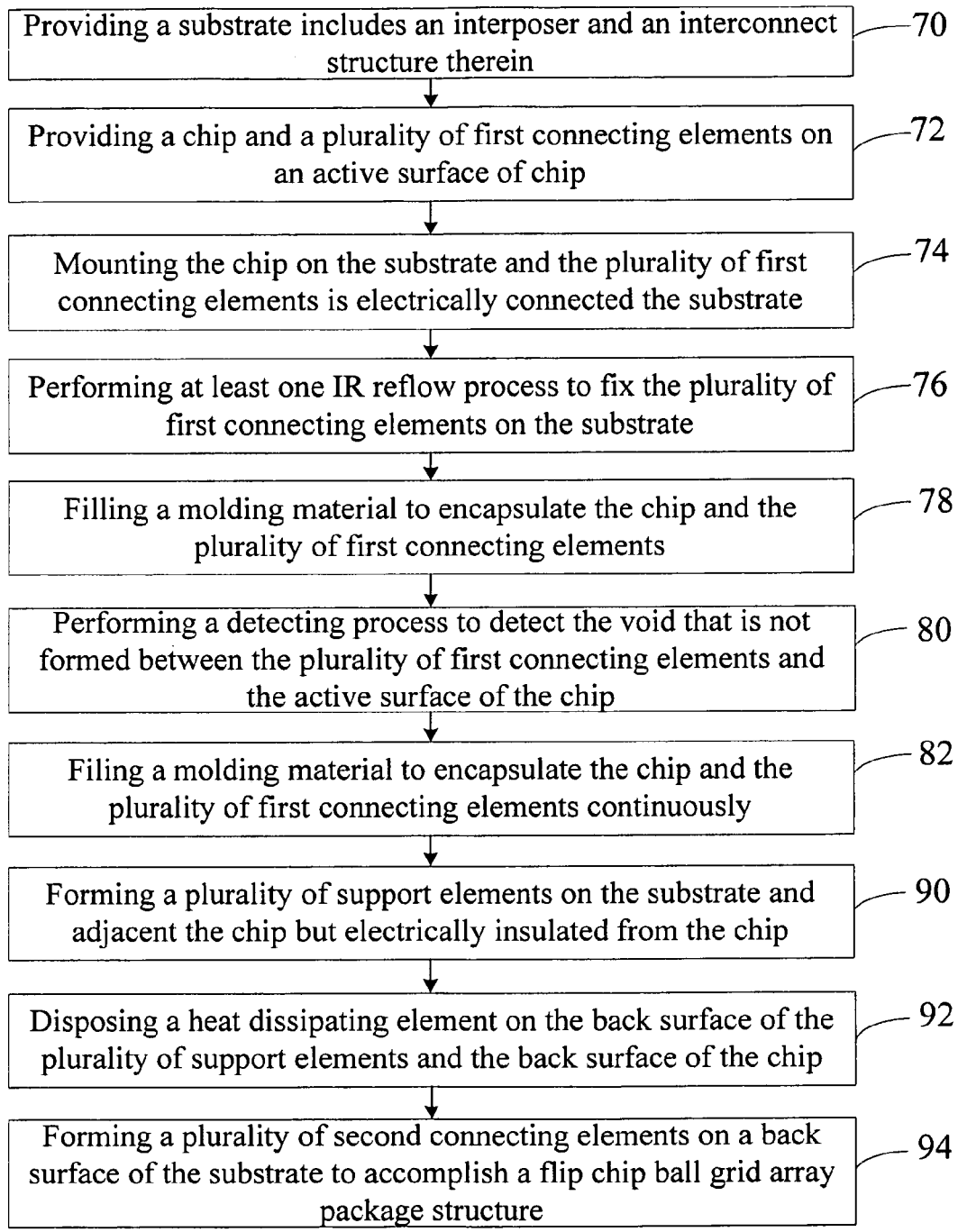
FIG. 5 shows the flow chart for detecting the under fill void in flip chip ball grid array package structure according to FIG. 3A and FIG. 3B.

Referring to FIG. 5; shows the flow chart for another method for detecting the flip chip ball grid array package structure of the present invention. In step 70, a substrate includes a top surface and a bottom surface, and substrate includes an interposer and an interconnect structure therein; in step 72, a chip includes an active surface and a plurality of first connecting elements on the active surface; in step 74, the active surface of the chip is inversed toward the top surface of the substrate and is mounted on the top surface of the substrate by using flip chip technology, and the plurality of first connecting elements on the active surface of the chip is electrically connected on the substrate by the interposer and the interconnect structure; in step 76, at least one IR reflow process is performed to fix the plurality of first connecting elements on the substrate; in step 78, a molding material is filled to encapsulate the active surface of the chip and the plurality of first connecting elements; and in step 80, a detecting process is performed to detect the void that is not formed in the connecting interface between the plurality of first connecting elements and the active surface of the chip. Herein, the flow chart for the step 70 to the step 84 is identical to the process of the illustration of FIG. 4; and the difference is that a plurality of support elements is formed on the top surface on the substrate and adjacent but electrically insulated from the chip. In step 92, a heat dissipating element is mounted on the back surface of the plurality of support elements and the back surface of the chip; and in step 94, a plurality of second connecting elements is formed on a back surface of the substrate to accomplish the flip-chip ball grid array package structure.

According to aforementioned, in order to avoid forming the void in the connecting interface between the active surface of the chip and the plurality of connecting elements during the under-filling process, the present invention performs at least one or more than once IR reflow process to heat the plurality of first connecting elements uniformly, so that the void is not formed in the middle of the plurality of first connecting elements and the active surface due to the deformation of the plurality of first connecting elements. Thus, the molding material can be encapsulated to cover the active surface of the chip and the plurality of first connecting elements completely, so that the circuit short between the connecting elements and the substrate would not be generated. Thus, the problem of the under fill void in the conventional flip chip ball grid array package structure can be solved.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. Method for detecting the under-fill void in flip chip BGA, comprising: providing a substrate having an interconnect structure and a plurality of interposers therein; providing a chip having an active surface and a back surface, and a plurality of first connecting elements on said active surface; mounting said chip on said substrate by inverting said chip so that said active surface of said chip faces said substrate, and said plurality of first connecting elements of said chip being electrically connected with said interconnect structure by said plurality of interposers; performing at least one IR reflow process to fix said plurality of first connecting elements on said substrate; performing a molding process to fill a molding material to encapsulate said active surface of said chip and said plurality of first connecting elements; forming a plurality of second connecting elements on a back surface of said substrate to accomplish a flip chip ball grid array package structure; and performing a detecting process to detect a void being not formed in a connecting interface between said plurality of first connecting elements and said active surface of said chip, after said step of performing said molding process, and between said step for said performing a molding to fill a molding material process and said step for said forming a plurality of second connecting elements on a back surface of said substrate.

2. The method according to claim 1, further comprising a plurality of pads is disposed between said plurality of first connecting elements.

3. The method according to claim 1, wherein said chip comprises CSRAM (custom SRAM).

4. The method according to claim 1, wherein said molding material comprises epoxy resin.

5. The method according to claim 1, wherein said detecting process comprises X-ray detecting method.

6. The method according to claim 1, further comprises performing another filling process after said step of said performing said detecting process.

7. The method according to claim 1, wherein said plurality of first connecting elements and said plurality of second connecting elements comprises solder ball.

8. A method for detecting an under-fill void in flip chip BGA, comprising: providing a substrate having an interconnect structure and a plurality of interposers therein; providing a chip having an active surface and a back surface, and a plurality of first connecting elements on said active surface; mounting said chip on said substrate by inverting said chip so that said active surface of said chip faces said substrate, and said plurality of first connecting elements of said chip being electrically connected with said interconnect structure by said plurality of interposers; performing at least one IR reflow process to fix said plurality of first connecting elements on said substrate; performing a first filling process to fill a molding material to encapsulate said active surface of said chip and said plurality of first connecting elements; performing a further filling process to fill said molding material to encapsulate said plurality of first connecting elements and said active surface of said chip; performing a detecting process to detect a void being not formed in a connecting interface between said plurality of first connecting elements and said active surface of said chip between said step of performing a first filling process to fill a molding material and said step of said performing a further filling process to fill said molding material; forming a plurality of support elements on said substrate, and adjacent and electrically insulated from said chip; disposing a heat dissipating element on a back surface of said plurality of support elements and said back surface of said chip; and forming a plurality of second connecting elements on a back surface of said substrate to accomplish a flip chip ball grid ball package structure.

9. The method according to claim 8, further comprising a plurality of pads is disposed between said plurality of first connecting elements.

10. The method according to claim 8, wherein said chip comprises CSRAM (custom SRAM).

11. The method according to claim 8, wherein said molding material comprises epoxy resin.

12. The method according to claim 8, wherein said detecting process comprises x-ray detecting method.

13. The method according to claim 8, further comprising an adhesive layer is formed between said plurality of supports and said substrate.

14. The method according to claim 8, wherein said plurality of support elements is selected from the group consisting of copper, copper-carbon, copper-tungsten, aluminum silicon carbide, aluminum, stainless, nickel, nickel-coated copper.

15. The method according to claim 8, further comprising an adhesive layer is formed between said heat dissipating element and said back surface of said chip.

16. The method according to claim 8, wherein said plurality of first connecting elements and said plurality of second connecting elements comprises solder ball.

* * * * *